United States Patent [19]
Hagiwara

[11] Patent Number: 5,381,210
[45] Date of Patent: Jan. 10, 1995

[54] EXPOSING APPARATUS
[75] Inventor: Shigeru Hagiwara, Kawasaki, Japan
[73] Assignee: Nikon Corporation, Tokyo, Japan
[21] Appl. No.: 160,950
[22] Filed: Dec. 3, 1993
[30] Foreign Application Priority Data Dec. 3, 1992 [JP] Japan .................................. 4-324022

[51] Int. Cl.⁶ .......................................... G03B 27/42
[52] U.S. Cl. ..................................... 355/53; 250/548; 356/401
[58] Field of Search ..................... 355/53, 67; 356/401; 250/548

[56] References Cited
U.S. PATENT DOCUMENTS

| 4,812,880 | 3/1989 | Ogawa et al. | 355/53 |
| 4,870,452 | 9/1989 | Tanimoto et al. | 355/53 |
| 5,137,363 | 8/1992 | Kosugi et al. | 356/401 |
| 5,138,176 | 8/1992 | Nishi | 250/548 |
| 5,150,173 | 9/1992 | Isobe et al. | 356/401 |
| 5,184,196 | 2/1993 | Nakagawa et al. | 356/401 |
| 5,204,535 | 4/1993 | Mizutani | 250/548 |
| 5,272,501 | 12/1993 | Nishi et al. | 355/53 |

Primary Examiner—Richard A. Wintercorn
Attorney, Agent, or Firm—Shapiro and Shapiro

[57] ABSTRACT

An exposing apparatus which has an alignment apparatus for detecting the relative positional relation between a mask having a pattern for transfer formed thereon and a photosensitive substrate having an alignment mark thereon by applying alignment light to the alignment mark and which exposes the photosensitive substrate to exposure light transmitted through the pattern for transfer, through a projection optical system includes an alignment optical system for causing the alignment light to pass at least once through the projection optical system, the alignment light being of a wavelength in the vicinity of three times the wavelength of the exposure light.

8 Claims, 4 Drawing Sheets

EXPOSING APPARATUS

BACKGROUND OF THE INVENTION

1. Field of the Invention

This invention relates to an exposing apparatus for transferring a pattern formed, for example, on a reticle (mask) onto a wafer, and particularly to an exposing apparatus provided with an alignment apparatus for detecting the relative position of the reticle (mask) and the wafer.

2. Related Background Art

When a semiconductive element, a liquid crystal display element or the like is to be manufactured by the lithography process, use is made of a projection exposing apparatus in which a pattern image on a photomask or a reticle (hereinafter generically referred to as the "reticle") is projected onto a wafer as a photosensitive substrate through a projection optical system. Generally, when a semiconductive element or the like is to be manufactured, a plurality of layers of circuit patterns are formed in superposed relationship with each other on a wafer. In this case, it is necessary to highly accurately effect the alignment of a pattern formed in the preceding step and a pattern image to be transferred this time, i.e., the relative alignment of the wafer and the reticle and therefore, an alignment apparatus is provided in the projection exposing apparatus.

As a conventional alignment apparatus, there is known an alignment apparatus for setting an alignment mark (wafer marks) formed near each shot area on a wafer to a predetermined positional relation to thereby effect the alignment of the wafer and a reticle. In this case, there are wafer mark detecting methods of the TTL (through-the-lens) type and the TTR (through-the-reticle) type, and in the method of the TTL type, the alignment mark on the wafer is detected by alignment light incident from between the reticle and the projection optical system through the projection optical system.

On the other hand, in the method of the TTR type, alignment light for detecting the wafer mark is applied from above the reticle and the alignment light transmitted through the reticle is applied to the wafer mark on the wafer through the projection optical system. The alignment light reflected by this wafer mark is received by a light receiving element in the alignment apparatus via the projection optical system and the reticle.

In any of these methods of the TTL type and the TTR type, light having a wavelength differing from that of exposure light and weak in sensitizing property to a photosensitive material (such as photoresist) has been used as the alignment light so that the photosensitive material applied onto the wafer may not be sensitized. Ultraviolet light of e.g. wavelength 248 nm has been used as the exposure light, and He-Ne laser light of wavelength 633 nm has been used as the alignment light. In this case, as antireflection coating formed on each lens element of the projection optical system, use has been made of multilayer coating designed to have an antireflection characteristic to both of the exposure light and the alignment light.

In order that as in the prior-art exposing apparatus, the antireflection coating provided on the projection optical system may have the antireflection characteristic to not only the exposure light but also the alignment light (wavelength 633 nm), it is necessary to provide complicated multilayer coating, and this leads to the inconvenience that the design and manufacuture of the antireflection coating are difficult.

Particularly, in a projection optical system for excimer laser using, for example, excimer laser light of wavelength 248 nm as exposure light, of the coating material is very much limited. If under such limitation, an attempt is made to provide antireflection coating for excimer laser light of wavelength 248 nm and He-Ne laser light of wavelength 633 nm, the antireflection characteristic will generally be deteriorated as compared with antireflection coating of respective single color. Further, the antireflection coating in that case is complicated multilayer film and therefore, the thickness of the film becomes great and the irregularity of the film thickness becomes liable to occur, and the irregularity of transmittance becomes liable to occur.

SUMMARY OF THE INVENTION

In view of the above-noted points, the present invention has as its object the provision of an exposing apparatus which readily enables the design and manufacture of the high-performance antireflection coating of a projection optical system to be accomplished when the detection of an alignment mark formed on a photosensitive substrate is effected with alignment light of a wavelength differing from that of exposure light passed at least once through the projection optical path.

The exposing apparatus according to the present invention is an exposing apparatus which has an alignment apparatus for detecting the relative positional relation between a mask on which a pattern for transfer is formed and a photosensitive substrate having an alignment mark with alignment light applied to the alignment mark and in which the photosensitive substrate is exposed through the projection optical system to exposure light transmitted through the pattern for transfer, and which comprises an alignment optical system for causing the alignment light to pass at least once through the projection optical system, the alignment light being of a wavelength nearly three times as long as the wavelength of the exposure light.

Also, the lens of the projection optical system is formed with antireflection coating which has substantially equal antireflection effects for both of the exposure light and the alignment light.

Further, the exposing apparatus of the present invention has a correction optical element disposed between the mask and the photosensitive substrate for creating, to the alignment light, on-axis chromatic aberration and/or chromatic difference of magnification in the direction opposite to on-axis chromatic aberration and/or chromatic difference of magnification created to the alignment light by the projection optical system, and uses light of a wavelength nearly three times as long as the wavelength of the exposure light as the alignment light.

In this case, as the alignment light, use can be made of continuous spectral light having its wavelength narrowed within the range of width of ±50 nm about a wavelength three times as long as the wavelength of the exposure light.

Also, as the alignment light, use may be made of a plurality of discrete spectral lights each having a wavelength within the range of width of ±50 nm about the wavelength three times as long as the wavelength of the exposure light.

Such principles of the present invention will now be described. Generally, the refractive index n, the wavelength $\lambda_E$ of exposure lights reflected by the upper and lower surfaces of antireflection film for exposure light having a film thickness d and the optical path difference $2 \cdot n \cdot d$ between the reflected lights satisfy the following relation:

$$2 \cdot n \cdot d = (2m+1)\lambda_E/2 \qquad (1)$$

$$(m = 0, 1, 2, 3, \dots)$$

So, the wavelength $\lambda_A$ of alignment light is chosen so as to be $\lambda_A = (2m+1)\lambda_E$, i.e., odd number times the wavelength $\lambda_E$ of the exposure light, whereby the following equation is established, and thus the antireflection film for the exposure light has the antireflection effect for the alignment light as well. Thus, according to the present invention, two-wavelength antireflection film can be designed and manufactured easily.

$$2 \cdot n \cdot d = (2m+1)\lambda_E/2 = \lambda_A \qquad (2)$$

Accordingly, by choosing the wavelength $\lambda_A$ of the alignment light so as to be odd number times as long as the wavelength $\lambda_E$ of the exposure light, the design and manufacture of antireflection film effective for both of the exposure light and the alignment light which is formed on each lens element of the projection optical system become easy. That is, as compared with antireflection film effective for both of He-Ne laser light of wavelength 633 nm heretofore often used as alignment light and the exposure light, thin coating of relatively simple structure can be used in the case of the present invention.

In this case, in contrast with the wavelength $\lambda_E$ of now usable exposure light, the practical range as the alignment light is light of a wavelength three times as long as the wavelength $\lambda_E$ of the exposure light. Also, as the alignment light, use may be made of a single discrete spectral light having a wavelength exactly three times as long as the wavelength $\lambda_E$ of the exposure light, but actually the alignment light may be of a wavelength nearly three times as long as the wavelength $\lambda_E$ of the exposure light.

Further, if the wavelength of the alignment light is within the range of width of ±50 nm about the wavelength three times as long as the wavelength of the exposure light, even if the alignment light is continuous spectral light having its wavelength narrowed, or a mixture of a plurality of discrete spectral lights, the design and manufacture of antireflection film are relatively easy. Further, there is an advantage that the interference effect in the photosensitive material on the photosensitive substrate is alleviated.

DESCRIPTION OF THE PREFERRED EMBODIMENTS

A first embodiment of an exposure apparatus according to the present invention will hereinafter be described with reference to the drawings. This embodiment is one in which the present invention is applied to an alignment apparatus provided in a projection exposing apparatus of the step and repeat type. In this embodiment, use is made of exposure light to which the pattern of a reticle is to be exposed on a wafer having a photosensitive material applied thereto, and alignment light which, unlike the exposure light, does not sensitize the photosensitive material and which is for detecting an alignment mark on a wafer (wafer mark) through a projection optical system.

Figure 1:
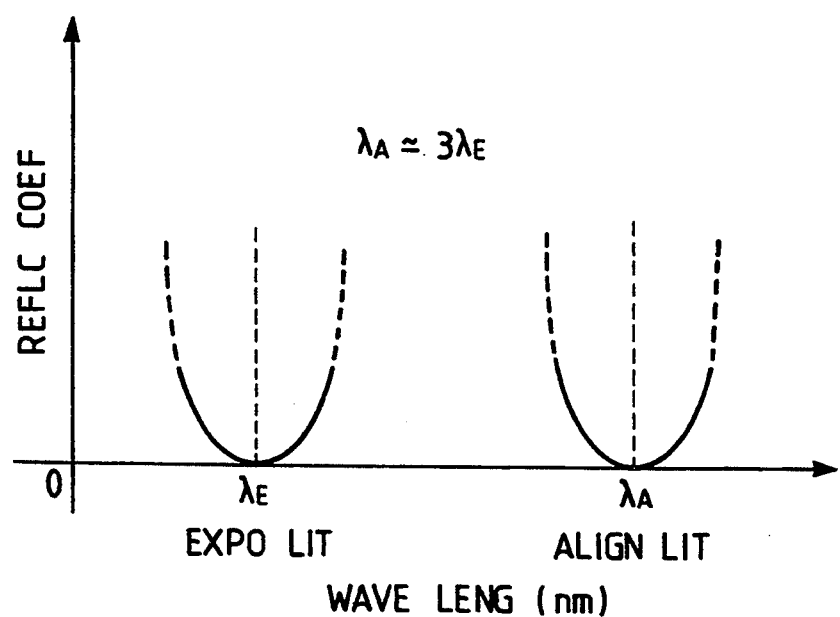
FIG. 1 is a graph showing the reflectances of a first embodiment of an alignment apparatus according to the present invention for exposure light and alignment light.

Accordingly, in the present embodiment, two-wavelength antireflection film effective for both of the exposure light and the alignment light must be formed on each lens element of the projection optical system. Therefore, in the present embodiment, as shown in FIG. 1, the wavelength $\lambda_A$ of the alignment light is made approximately three times as long as the wavelength $\lambda_E$ of the exposure light, and the reflectances of the antireflection film for the alignment light and the exposure light, respectively, are made substantially 0. The specific construction of the apparatus will first be described although the details will be described later.

Figure 2:
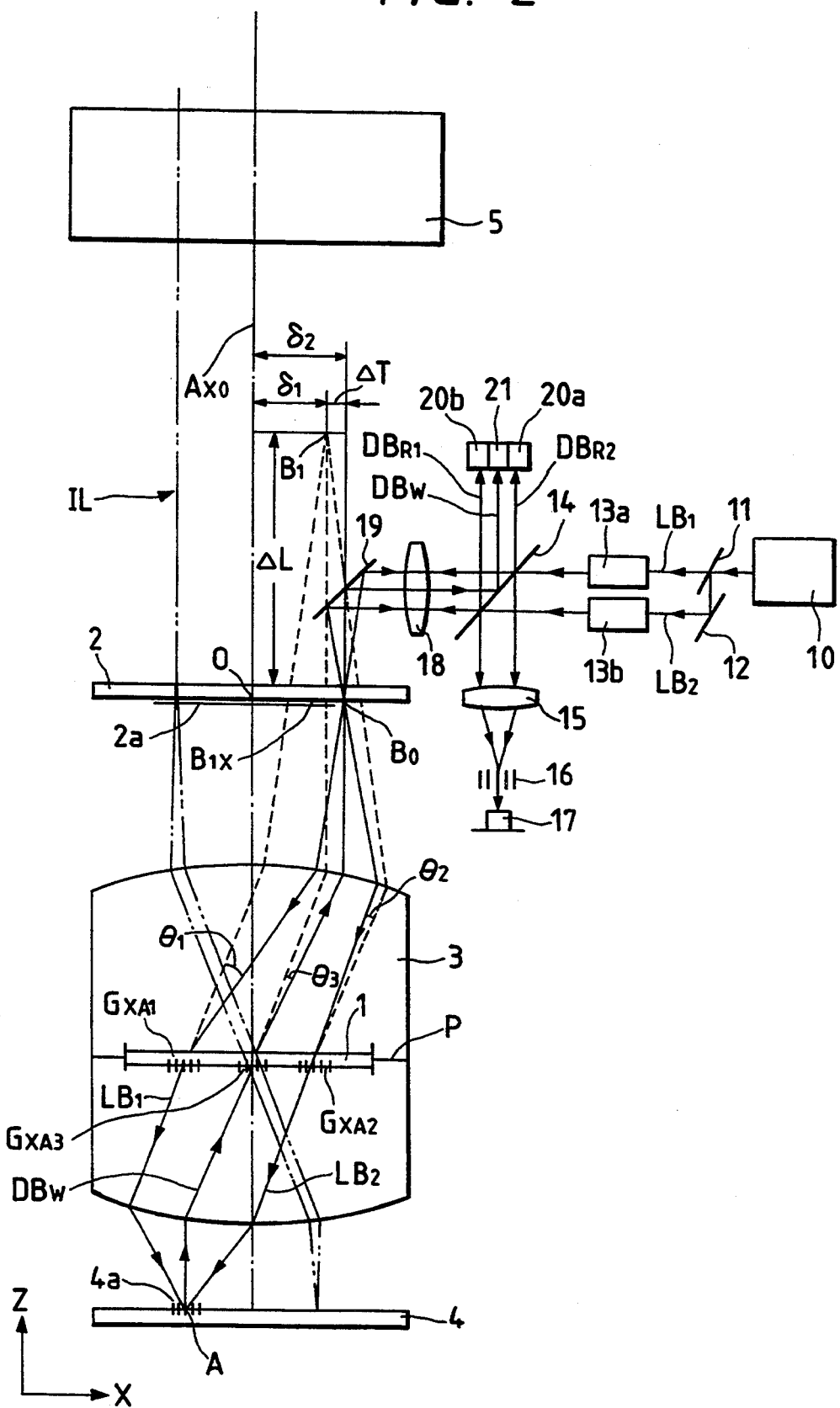
FIG. 2 schematically shows the construction of the essential portions of a projection exposing apparatus according to a first embodiment of the present invention.

Referring to FIG. 2 which schematically shows the construction of the essential portions of the projection exposing apparatus according to the present embodiment, a reticle 2 having a predetermined circuit pattern formed thereon and a wafer 4 are disposed conjugately with respect to the projection optical system (projection objective lens) 3 under the exposure light, and the reticle 2 and wafer 4 are held on two-dimensionally movable stages, not shown. An illumination optical system 5 is provided above the projection optical system 3, and for example, excimer laser light (KrF) excimer laser light of wavelength 249 nm or ArF excimer laser light of wavelength 193 nm) supplied as the exposure light from the illumination optical system 5 uniformly illuminates the reticle 2, and the circuit pattern on the reticle 2 is transferred onto the wafer 4 by the projection optical system 3.

The projection optical system 3 is designed so as to be telecentric on the reticle side and the wafer side and has its chromatic aberration corrected well for the excimer laser light as the exposure light.

Diffraction grating marks RMx and WMx for alignment are formed on the reticle 2 and the wafer 4, respectively.

Now, the wafer 4 is adsorption-held on a stage, not shown, two-dimensionally moved in the step and repeat fashion, and the transfer exposure of the reticle 2 to a shot area on the wafer 4 is terminated, the wafer 4 is stepped to the next shot position. A movable mirror for reflecting a laser beam from a laser light wave interference type length measuring machine (hereinafter referred to as the "interferometer") for detecting the positions of the reticle 2 in X direction, Y direction and the direction of rotation (θ) in a horizontal plane is fixed to a portion of a reticle stage, not shown. This interferometer has three length measuring laser beams to detect the positions in X direction, Y direction and θ direction independently of one another, but for the simplification of description, it is not shown here. The movement stroke of the reticle stage is several millimeters or less, and the detection resolving power of the interferometer is determined to e.g. the order of 0.01 μm.

On the other hand, a movable mirror for reflecting a laser beam from an interferometer for detecting the positions of the wafer 4 in X direction and Y direction in a horizontal plane is also fixed to a portion of the wafer stage, not shown. This interferometer also has two length measuring laser beams to detect the positions in X direction and Y direction, but for the simplification of description, it is not shown here. The driving of the reticle stage in X direction, Y direction and θ direction is effected by a driving motor, not shown, and the two-dimensional movement of the wafer stage is effected by a driving motor independent of the driving motor for the reticle stage.

Description will now be made of the alignment optical system of the exposing apparatus shown in FIG. 2. As regards alignment light for alignment, a light beam emitted from a laser beam source 10 which generates light of a wavelength differing from that of exposure light IL is divided into light beams LB1 and LB2 by a half mirror 11 as an optical path dividing member. The light beams LB1 and LB2 divided by the half mirror 11 enter acousto-optical elements 13a and 13b, respectively, as light modulators, and the light beams LB1 and LB2 emerging from the acousto-optical elements 13a and 13b, respectively, have a frequency difference of Δf relative to each other. The light beams LB1 and LB2 emerging from the acousto-optical elements 13a and 13b, respectively, are each divided into transmitted light and reflected light by a half mirror 14, and the light beams LB1 and LB2 reflected by the half mirror 14 are condensed by a condensing lens 15. A diffraction grating 16 for reference is disposed at the condensed position of these light beams, and interference fringes are formed on the diffraction grating 16 by the two light beams having the relative frequency differnece Δf. Diffracted light passed through the diffraction grating 16 is photoelectrically detected by a photoelectric detector 17, whereby a sine wave-like AC signal as a reference signal is obtained.

On the other hand, the two light beams LB1 and LB2 passed through the half mirror 14 are condensed on a reticle mark RMx provided outside the exposure area of the reticle 2, via an objective lens 18 for alignment and a reflecting mirror 19. At this time, an interference fringe flowing at a speed determined in conformity with the frequency difference Δf between the light beams LB1 and LB2 is formed on the reticle mark RMx.

Figure 3:
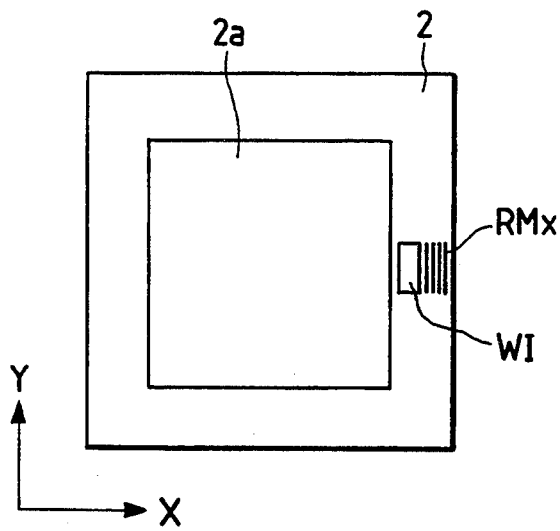
FIG. 3 is a plan view showing a reticle in the first embodiment of the present invention.

Detected light $DB_{R1}$ reflected and diffracted by the reticel mark RMx and reversely following the optical path of the light beam LB1 and detected light $DB_{R2}$ reversely following the optical path of the light beam LB2 again pass via the reflecting mirror 19, the objective lens 18 and the half mirror 14, and thereafter arrive at photoelectric detectors 20a and 20b, respectively, provided at locations conjugate with the pupil of the objective lens 18. A position signal from the reticle mark RMx is detected as a sine wave-like AC signal by these photoelectric detectors 20a and 20b. The reticle mark RMx, as shown in FIG. 3, is comprised of a diffraction grating having a pitch in X direction (measuring direction) outside the exposure area 2a of the reticle 2. Also, a transmission window WI (hereinafter referred to as the "reticle window") is formed at a location adjacent to the reticle mark RMx. Accordingly, the irradiating lights LB1 and LB2 condensed on the reticle 2 by the objective lens 18 of the alignment optical system illuminate the reticle 2 from two directions with a predetermined angle of intersection so as to cover not only the reticle mark RMx but also the reticle window WI at a time.

Description will now be made of the light beams LB1 and LB2 illuminating the reticle window WI provided adjacent to the reticle mark RMx, from two directions with the predetermined angle of intersection. The light beams LB1 and LB2 illuminating the reticle mark RMx from two directions with the predetermined angle of intersection intactly pass through the reticle window and enter the projection optical system 3 from off the axis, as shown in FIG. 2.

Figure 4:
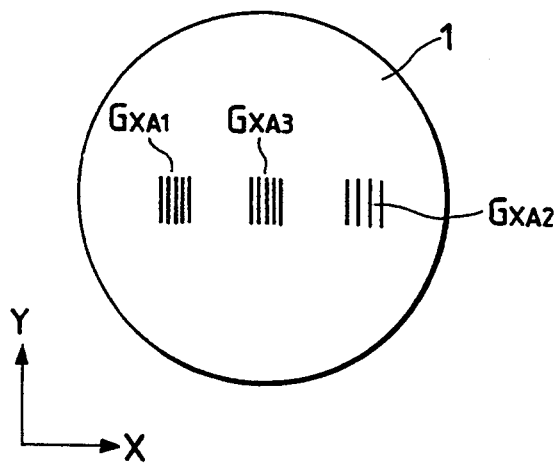
FIG. 4 is a plan view showing a diffraction grating formed on the pupil of a projection optical system in the first embodiment of the present invention.

The projection optical system 3 has its chromatic aberration sufficiently corrected for the exposure light IL, but has its chromatic aberration not corrected for the alignment light differing in wavelength from the exposure light IL. Therefore, on the pupil (entrance pupil) plane P of the projection optical system 3, as shown in FIG. 4, three diffraction gratings $G_{XA1}$ to $G_{XA3}$ (correction optical elements) having different pitches are disposed on the transparent circular substrate 1 along the measuring direction (X direction) passing through the center of the optical axis of the projection optical system 3. The diffraction grating $G_{XA3}$ is provided on the optical axis $AX_0$ of the projection optical system 3, and the diffraction gratings $G_{XA1}$ and $G_{XA2}$ are provided bisymmetrically with respect to the diffraction grating $G_{XA3}$ (the optical axis of the projection optical system 3). The diffraction gratings $G_{XA1}$ to $G_{XA3}$ are arranged along the measuring direction (X direction) so that their pitches may be closer in the order of $G_{XA2}$, $G_{XA3}$, and $G_{XA1}$.

Figure 5:
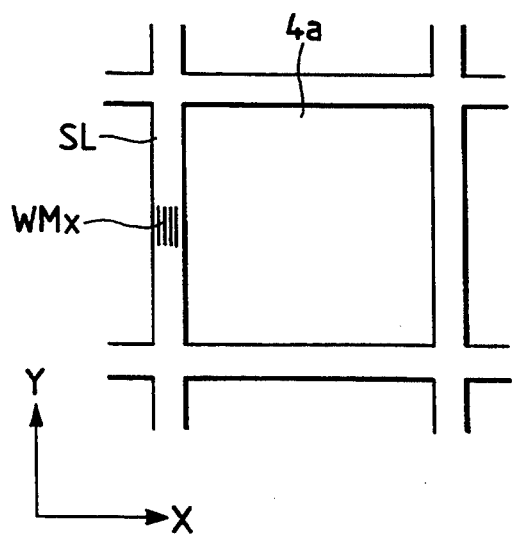
FIG. 5 is an enlarged plan view showing a wafer mark in the first embodiment of the present invention.

Now, turning back to FIG. 2, the irradiating lights LB1 and LB2 which have entered the projection optical system 3 from off the axis and have arrived at the pupil (entrance pupil) of the projection optical system 3 are deflected (diffracted) by the diffraction gratings $G_{XA1}$ and $G_{XA2}$ (irradiating light correction optical elements), respectively, so as to be corrected by the angles of correction $\theta_1$-$\theta_2$ thereof, and irradiate a wafer mark WMx formed on the wafer 4, from two directions with a predetermined angle of intersection. Thereupon, a flowing interference fringe is formed on the wafer mark WMx. The wafer mark WMx, as shown in FIG. 5, is comprised of a diffraction grating having a pitch in X direction (measuring direction) on a street line SL outside one shot area 4a.

Turning back to FIG. 2, detected light DBw (−1st-order light LBW1 (−1) and 1st-order light LBW2 (+1)) created in the direction of normal to the wafer mark WMx travels on the optical path of the principal ray of the projection optical system 3, and is deflected (diffracted) by an angle of correction $\theta_3$ by the diffraction grating $G_{XA3}$ (detected light correction optical element) provided at the center of the pupil plane P of the projection optical system 3, and thereafter arrives at a photoelectric detector 21 again via the reticle window WI, the reflecting mirror 19, the objective lens 18 and the half mirror 14. The photoelectric detector 21, like the above-described photoelectric detectors 20a and 20b, is provided at a location conjugate with the pupil of the objective lens 18 (or the projection optical system 3).

As described above, a reference signal obtained by the photoelectric detector 17, a reticle position signal including the position information of the reticle 2 obtained by the photoelectric detectors 20a and 20b, and a wafer position signal including the position information of the wafer 4 obtained by the photoelectric detector 21 are detected by the basic construction of the first embodiment of the present invention.

Description will now be made of the relative alignment of the reticle 2 and the wafer 4. With the photoelectrically converted signal (sine wave AC signal) from the photoelectric detector 17 as a basic signal, the phase difference $\phi r$ thereof from the photoelectrically converted signal (sine wave AC signal) of the diffracted light from the reticle mark RMx obtained by the photoelectric detectors 20a, 20b is detected by a phase detecting system, not shown. In the same manner, the phase difference $\phi w$ between the photoelectrically converted signal of the diffracted light from the wafer mark WMx obtained by the photoelectric detector 21 and the basic signal is detected by the phase detecting system. If the difference between the phase differences $\phi r$ and $\phi w$ is then found, the amount of deviation in X direction between the reticle 2 and the wafer 4 can be known. This detection system is called the optical heterodyne system, and is convenient for applying the positional servo of a closed loop so that any minute positional deviation may not occur while the pattern of the reticle 2 is exposed onto the resist of the wafer 4, because if the reticle 2 and the wafer 4 are within a positional error range within one pitch of the reticle mark and within ½ pitch of the wafer mark, any positional deviation can be detected with high resolving power even if the reticle and wafer are in a stationary state.

In this detection method, the reticle 2 or the wafer 4 is moved so that the phase difference ($\phi r-\phi w$) may become zero (or a predetermined value), to thereby complete the alignment, whereafter in the alignment position, servo lock can be applied so that the reticle 2 and the wafer 4 may not move relative to each other.

In the present embodiment, during the exposure of the step and repeat type, the movement of the wafer stage to each shot area on the wafer can be effected on the basis of the measured value by the interferometer, and when the wafer mark WMx is positioned in the irradiation area of the two light beams LB1 and LB2 at the accuracy of ±½ pitch, the reticle stage or the wafer stage can be servo-controlled by a servo system, not shown, on the basis of only the information from the phase detecting system, not shown. At this time, the driving of the reticle stage or the wafer stage can be effected by a DC motor, and an analog voltage corresponding to the phase difference ($\phi r-\phi w$) can be created by a D/A converter or the like, and this analog voltage can be directly applied as a deviation voltage to the servo circuit of the DC motor. This servo is effected till the termination of the exposure of that shot area.

If this is done, it is possible to reduce the minute fluctuation of the stages caused by the fluctuation or the like of the air density of the beam optical path of the interferometer, because this servo is not servo conforming to the measured value by the interferometer. Therefore, at a point of time whereat phase difference information capable of servo control is obtained from the phase detecting system, not shown, the measured value by the interferometer on the wafer stage side is separated from the servo system on the wafer stage side and the applied voltage to the motor for the wafer stage is rendered zero, and the above-mentioned analog voltage is applied to the servo system on the reticle stage side.

If this is done, a minute fluctuation created particularly on the wafer stage side during the exposing operation can be suppressed and slow drift-like fine movement can be provided, and the reticle stage is moved at a high speed following the movement of the wafer stage, whereby the relative positional deviation between the reticle and the wafer can be kept substantially zero. Therefore, very faithful transfer is achieved without the thickening of the line width of the exposed pattern and any reduction in resolution.

The two AC signals of the frequency of the interference beat signal obtained by the photoelectric detectors 20a and 20b are identical in the nature of signal and any of these signals may be sent to the phase detecting system, not shown. In the present embodiment, however, the light information from the reticle is made by the interference between the 0-order diffracted light and 1st-order diffracted light of the light beams LB1 and LB2 and therefore, if the intensities (quantities) of the 1st-order light and the 0-order light differ greatly from each other, offset may possibly arise during the measurement of the phase difference. So, one of said AC signals may be passed through an analog circuit for calculating the sum of (or the difference between) the two signals from the photoelectric detectors 20a and 20b, whereafter the phase difference between it and the reference signal from the photoelectric detector 17 may be measured. Of course, a changeover system may be adopted so that one of the two signals from the photoelectric detectors 20a and 20b or a signal obtained by combining the two signals may be used.

Description will now be made of specific examples of the exposure light IL and alignment light in the present embodiment. First, in the present embodiment, KrF excimer laser source is used as the light source of the exposure light IL, and light of wavelength 248.4 nm is employed as the exposure light IL. Also, for the comparison with the example of the prior art, an example of antireflection film using popular materials provided on the lens element of the projection optical system 3 when He-Ne laser light of wavelength 633 nm is used as the alignment light is shown in Table 1 below. In Table 1, the film thickness is the actual film thickness d corrected by the refractive index n, and further divided by the central wavelength $\lambda_c$ (in this case, 248.4 nm).

TABLE 1

| Materials | Refractive index n | Film thickness (nd/$\lambda_c$) |
|---|---|---|
| synthetic quartz (substrate) | 1.46 | ∞ |
| Al$_2$O$_3$ | 1.63 | 0.32 |
| ZrO$_2$ | 2.05 | 0.07 |
| Al$_2$O$_3$ | 1.63 | 0.57 |

TABLE 1-continued

| Materials | Refractive index n | Film thickness (nd/λ_c) |
|---|---|---|
| ZrO_2 | 2.05 | 0.46 |
| Al_2O_3 | 1.63 | 0.54 |
| ZrO_2 | 2.05 | 0.08 |
| MgF_2 | 1.38 | 0.28 |
| Air | 1.00 | ∞ |

Figure 6:
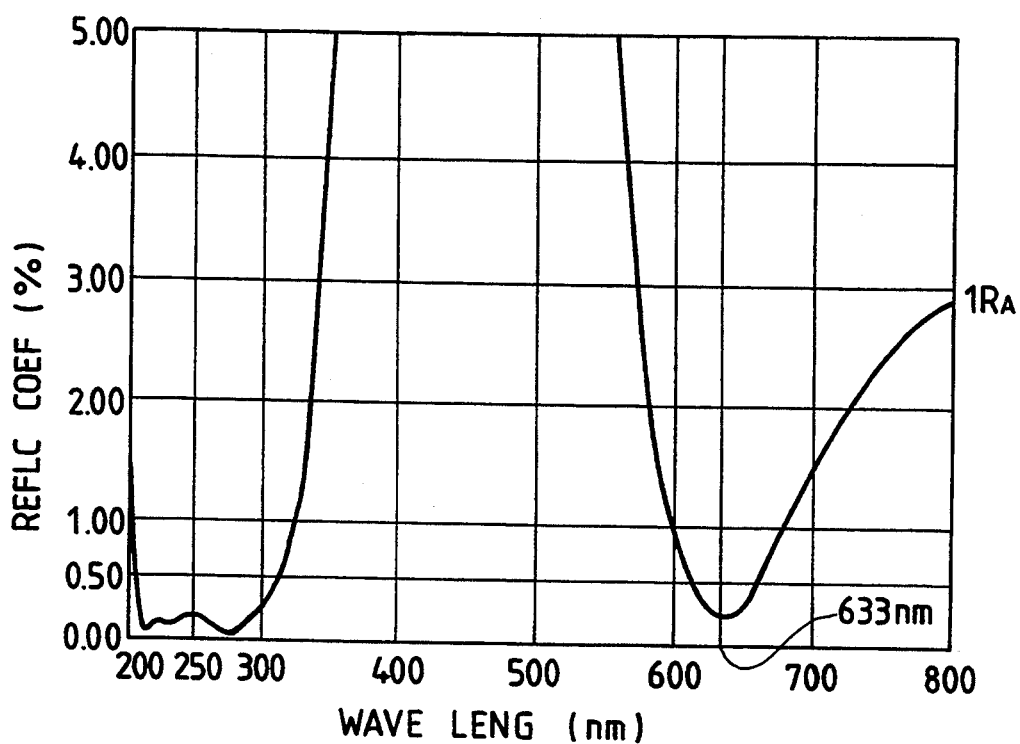
FIG. 6 is a graph showing the spectral characteristic of two-wavelength antireflection film designed for 248.4 nm and 633 nm.

The spectral characteristic of this antireflection film is shown in FIG. 6. It is seen from Table 1 that when light of wavelength 633 nm is used as the alignment light, at least seven layers are necessary as the antireflection film therefor.

In contrast, in the first embodiment, light of wavelength 745.2 nm which is three times as long as the wavelength 248.4 nm of the exposure light IL is used as the alignment light. This alignment light of wavelength 745.2 nm is obtained by using a tunable laser, and the wavelength band thereof is of the order of that of He-Ne laser light.

An example of the antireflection film when this light is used as the alignment light is shown in Table 2 below.

TABLE 2

| Materials | Refractive index n | Film thickness (nd/λ_c) |
|---|---|---|
| synthetic quartz (substrate) | 1.46 | ∞ |
| Al_2O_3 | 1.63 | 0.23 |
| ZrO_2 | 2.05 | 0.44 |
| Al_2O_3 | 1.63 | 0.57 |
| ZrO_2 | 2.05 | 0.10 |
| MgF_2 | 1.38 | 0.29 |
| Air | 1.00 | ∞ |

Figure 7:
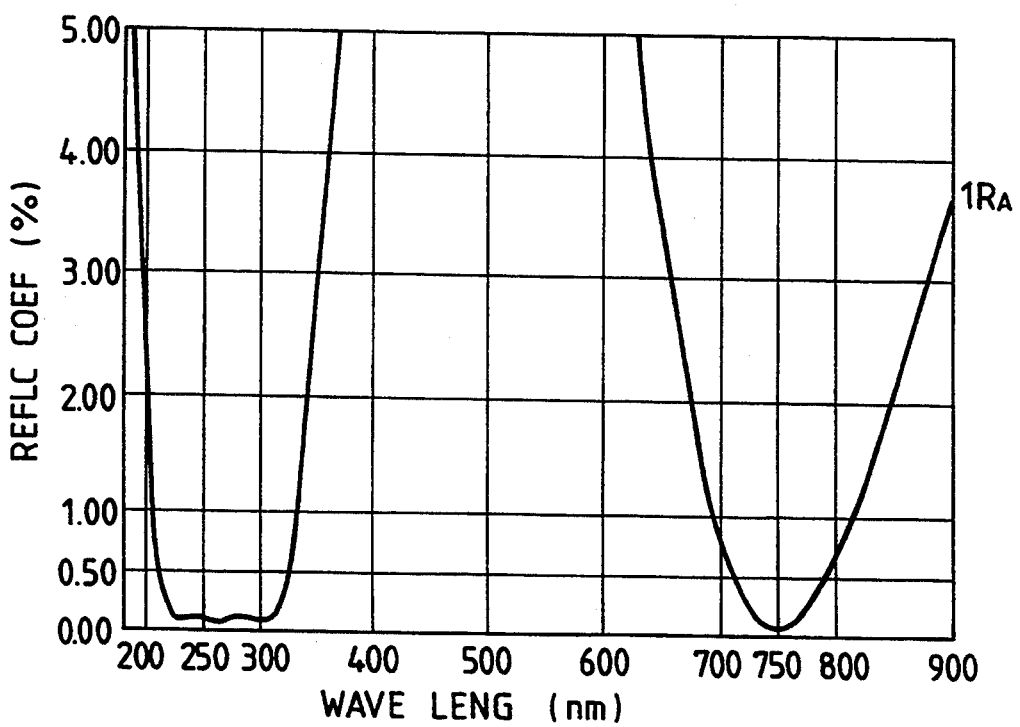
FIG. 7 is a graph showing the spectral characteristic of two-wavelength antireflection film designed for 248.2 nm and a wavelength three times as long as it.

The spectral characteristic of the antireflection film of Table 2 is shown in FIG. 7. It is seen from Table 2 that when light of wavelength 745.2 nm is adopted as the alignment light, only five layers are required for the antireflection film therefor. Also, from the comparison between FIGS. 6 and 7, it is seen that according to the present embodiment, the antireflection characteristic for the alignment light is also improved. That is, antireflection film of a simple construction having a smaller number of layers can be provided when antireflection film having an antireflection characteristic for both of the light of 745.2 nm and the exposure light IL is designed and made than when antireflection film having an antireflection characteristic for both of the He-Ne laser light of wavelength 633 nm and the exposure light IL. Accordingly, an exposing apparatus of relatively simple construction can be achieved by the first embodiment.

A second embodiment of the present invention will now be described. In the second embodiment, light emitted from a semiconductor laser having as its oscillation wavelength a wavelength 750 nm which is a wavelength in the vicinity of 745.2 nm which is three times as long as the wavelength of the exposure light IL is used as the alignment light. In the other points, the second embodiment is the same as the first embodiment. The semiconductor laser has the advantage that it is relatively inexpensive and is readily available and is very compact. An exposing apparatus of inexpensive and compact construction can be achieved by the second embodiment.

A third embodiment of the present invention will now be described. In the third embodiment, light made polychromatic by light of a wavelength in the vicinity of 745.2 nm which is three times as long as the wavelength of the exposure light IL is used as the alignment light. Therefore, white light, for example, from a halogen lamp as a light source is narrowed to a certain degree by an interference filter or the like, whereby there is produced light of a wavelength range having a width of the order of ±50 nm in the vicinity of 745.2 nm. This light having a certain degree of width in its wavelength is used as the alignment light. In the other points, the third embodiment is the same as the first embodiment.

Generally, when monochromatic light is used as the alignment light, the alignment light may cause interference on the resist layer of the alignment mark and spoil alignment information. So, in the third embodiment, the light is made polychromatic in order to prevent the alignment information from being spoiled by the interference. In order to examine what degree of difference in wavelength could be between two lights in the vicinity of 745.2 nm differing in wavelength from each other in order that the two lights may not interfere with each other, simulation has been carried out on the assumption that the level difference of the diffraction grating which is the alignment mark is 0.6 to 1.0 μm and as a result, it has been found that the difference is 60 to 100 nm.

Figure 8:
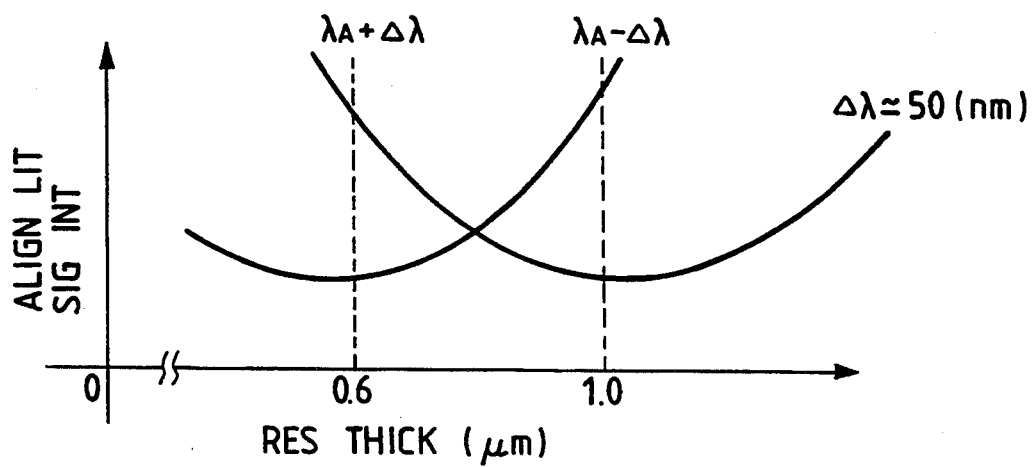
FIG. 8 graphically shows the manner in which a plurality of lights differing in wavelength make us for the deterioration of the signal intensity of alignment light.

That is, two or more lights differing in wavelength which are in a wavelength range of 60 to 100 nm at greatest with 745.2 nm as the center are used as the alignment light, whereby on the resist layer of the alignment mark, the alignment information is not spoiled by interference. FIG. 8 shows the manner in which the signal intensity of the alignment light is made up for by light of wavelength $(\lambda_A + \Delta\lambda)$ and light of wavelength $(\lambda_A - \Delta\lambda)$.

Also, it has been found by simulation that in the wavelength range of 745.2±50 nm, the reflectance of the antireflection film is suppressed to the order of 0.5%. Accordingly, white light is continuously distributed over the wavelength range of 745.2±50 nm and the polychromatic light thereof is used for alignment, whereby it becomes possible to fully make the most of the characteristic of antireflection film of relatively simple construction. So, it is to be understood that the range of narrowed band of the halogen lamp used in the third embodiment is ±50 nm. An exposing apparatus using antireflection film of relatively simple construction and strong to a process wafer can be achieved by the third embodiment.

A fourth embodiment of the present invention will now be described. In the fourth embodiment, the alignment light is made polychromatic in the vicinity of 745.2 nm which is three times as long as the wavelength of the exposure light IL. In the third embodiment, alignment light having a continuous wavelength distribution in the vicinity of 745.2 nm is obtained by the use of a white light source, while in the fourth embodiment, the alignment light is made polychromatic by the use of a plurality of monochromatic lights having different wavelengths in the same wavelength range as that in the third embodiment. The monochromatic lights used in this case include, besides the light of wavelength 745.2 nm by the tunable laser mentioned in the first embodiment and the light of wavelength 750 nm by the semiconductor laser mentioned in the second embodiment, light of wavelength 690 nm having a band width of the order of ±50 nm, laser light of wavelength 780 nm, laser light of wavelength 810 nm, etc. Two or three of these lights are combined together .to thereby sufficiently endow the alignment light with an expanse of the order of 60–100 nm and make the alignment light polychromatic. In this case, the light of wavelength 745.2 nm or the light of wavelength 750 nm need not always be used.

Antireflection coating aiming at a wavelength 48.4 nm and a wavelength 745.2 nm has a sufficiently allowable antireflection effect if within a wavelength range in the vicinity of 745.2±50 nm and therefore, using a plurality of lights differing in wavelength by the order of 60 to 100 nm within that range is not against the purport of the present invention. An effect equal to that of the third embodiment can be attained by the fourth embodiment.

In the above-described embodiments, a laser light wave interference type length measuring machine is employed as the length measuring system during alignment, but so far as the alignment mechanism is one using alignment light of a wavelength about three times as long as the wavelength of the exposure light IL through the projection optical system 3, it is not always necessary to employ the laser light wave interference type length measuring machine. Also, the alignment apparatus in the above-described embodiments is an example of the TTR type, but of course, the present invention can be equally applied to an alignment apparatus of the TTL ( through-the-lens ) type.

Also, in the aforedescribed alignment optical system, the alignment light incident on the wafer mark WMx and the alignment light emerging from the wafer mark WMx pass through the projection optical system 3, but the present invention is not restricted thereto. That is, the alignment optical system may be designed such that only the alignment light incident on the wafer mark WMx passes through the projection optical system 3, or the alignment optical system may be designed such that only the alignment light emerging from the wafer mark WMx passes through the projection optical system 3.

Further, in the above-described embodiments, the alignment light passes through the reticle mark RMx on the mask 2, but the alignment light need not always be passed through the reticle mark RMx on the mask 2. For example, the location of the mask 2 may be memorized in advance and the alignment light may be applied to only the wafer mark WMx on the wafer 4 to thereby detect the location of the wafer 4 and detect the relative location of the wafer 4 and the mask 2.

Also, an important point in the present invention is that light in the vicinity of a wavelength three times as long as the wavelength of the exposure light IL is used as the alignment light passing through the projection optical system 3. Accordingly, the exposure light IL is not limited to the light of wavelength 248.4 nm which is the above-described KrF excimer laser light, but light of other wavelength may be used instead. Even when light of other wavelength is used, an effect similar to that of the above-described embodiments can be obtained so far as light in the vicinity of a wavelength three times as long as the wavelength of the exposure light IL is used as the alignment light.

Thus, the present invention is not restricted to the above-described embodiments, but can assume various constructions without departing from the gist of the invention.

What is claimed is:

1. An exposing apparatus which has an alignment apparatus for detecting the relative positional relation between a mask having a pattern for transfer formed thereon and a photosensitive substrate having an alignment mark thereon by applying alignment light to said alignment mark and which exposes said photosensitive substrate to exposure light transmitted through said pattern for transfer, through a projection optical system, including:

(a) an alignment optical system for causing said alignment light to pass at least once through said projection optical system;

said alignment light being of a wavelength in the vicinity of three times the wavelength of said exposure light.

2. An exposing apparatus according to claim 1, wherein antireflection coating is formed on said projection optical system, and said antireflection coating has substantially equal antireflection effects for both of said exposure light and said alignment light.

3. An exposing apparatus according to claim 1, further comprising a correction optical system disposed between said mask and said photosensitive substrate for correcting on-axis chromatic aberration and/or chromatic difference of magnification created for said alignment light by said projection optical system.

4. An exposing apparatus according to claim 1, wherein said exposure light is KrF excimer laser of wavelength 248.4 nm, and said alignment light has its wavelength set to 745.2 nm by a tunable laser.

5. An exposing apparatus according to claim 1, wherein continuous spectral light having its wavelength narrowed within the range of width of ±50 nm about a wavelength three times as long as the wavelength of said exposure light is used as said alignment light.

6. An exposing apparatus according to claim 5, wherein said exposure light is KrF excimer laser of wavelength 248.4 nm, and said alignment light is a semiconductor laser of wavelength 750 nm.

7. An exposing apparatus according to claim 1, wherein a plurality of discrete spectral lights each having a wavelength within the range of width of ±50 nm about a wavelength three times as long as the wavelength of said exposure light.

8. An exposing apparatus according to claim 7, wherein said exposure light is KrF excimer laser of wavelength 248.4 nm, and said alignment light is from a halogen lamp as a light source and has its wavelength set to 745.2±50 nm by an interference filter.

* * * * *